US010332889B2

(12) United States Patent
Lin et al.

(10) Patent No.: US 10,332,889 B2
(45) Date of Patent: Jun. 25, 2019

(54) METHOD OF MANUFACTURING A SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Ger-Pin Lin, Tainan (TW); Tien-Chen Chan, Tainan (TW); Shu-Yen Chan, Changhua County (TW); Chi-Mao Hsu, Tainan (TW); Shih-Fang Tzou, Tainan (TW); Ting-Pang Chung, Taichung (TW); Chia-Wei Wu, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/951,194

(22) Filed: Apr. 12, 2018

(65) Prior Publication Data

US 2019/0074280 A1    Mar. 7, 2019

(30) Foreign Application Priority Data

Sep. 4, 2017    (CN) .......................... 2017 1 0785056

(51) Int. Cl.
| | | |
|---|---|---|
| H01L 21/00 | (2006.01) | |
| H01L 27/108 | (2006.01) | |
| H01L 21/02 | (2006.01) | |
| H01L 21/324 | (2006.01) | |
| H01L 21/48 | (2006.01) | |
| H01L 21/762 | (2006.01) | |

(52) U.S. Cl.
CPC .. H01L 27/10873 (2013.01); H01L 21/02532 (2013.01); H01L 21/02543 (2013.01); H01L 21/02576 (2013.01); H01L 21/324 (2013.01); H01L 21/4814 (2013.01); H01L 21/762 (2013.01)

(58) Field of Classification Search
CPC ......... H01L 27/10873; H01L 21/02543; H01L 21/762
See application file for complete search history.

(56) References Cited

U.S. PATENT DOCUMENTS 6,358,813 B1    3/2002 Holmes
2013/0102131 A1*  4/2013 Yamaguchi ......... C23C 16/0272
                                                            438/478

OTHER PUBLICATIONS

Ishwar Bhati, DRAM Refresh Mechanisms, Penalties, and Trade-Offs, Mar. 27, 2015.

* cited by examiner

Primary Examiner — Laura M Menz
(74) Attorney, Agent, or Firm — Winston Hsu

(57) ABSTRACT

A method of manufacturing a semiconductor device is provided, which includes the steps of providing a capacitor structure, forming a conductive layer on the capacitor structure, performing a hydrogen doping process to the conductive layer, forming a metal layer on the conductive layer after the hydrogen doping process, and patterning the metal layer and the conductive layer to form a top electrode plate.

10 Claims, 5 Drawing Sheets

METHOD OF MANUFACTURING A SEMICONDUCTOR DEVICE

BACKGROUND OF THE INVENTION

1. Field of the Invention

The present invention relates generally to a method of fabricating a semiconductor device. More particularly, the present invention relates to a method of fabricating a capacitor structure in a dynamic random access memory.

2. Description of the Prior Art

A dynamic random access memory (DRAM) stores one bit of data using one transistor and one capacitor. Because the charge in the capacitor is lost over time, it must be periodically refreshed to maintain the contents of the memory, so it is called dynamic. The structure of DRAM is relatively simple, it uses only one transistor and one capacitor to store one bit of data, so its production cost is relatively low. However, the access speed of the DRAM is relatively slow, and the charging and discharging of the capacitor takes a long time. Therefore, it is mostly used in memory requirements that require high capacity but have low speed requirements, such as a personal computer motherboard.

Since DRAM needs periodic refreshing actions to save stored data, its operation has additional energy consumption, and as the speed, performance, and accumulation of DRAM increases, the proportion of the DRAM's overall energy consumption accounted for by the energy consumption of this refreshing operation is also getting higher, and it can even reach 20% of the overall energy consumption. Therefore, how to reduce the refreshing frequency of DRAM in order to reduce the energy consumption of DRAM has become an issue that the industry is currently striving to research and develop.

SUMMARY OF THE INVENTION

In view of the energy consumption problem caused by the aforementioned DRAM refreshing action, the present invention proposes a new process method that improves the required recharging rate by doping hydrogen in the conductor layer above the DRAM capacitor structure, thereby reducing the required energy consumption for refreshing action.

One of the objectives of the present invention is to provide a method of manufacturing a semiconductor device, including: providing a substrate having at least one capacitor structure, wherein the capacitor structure includes a lower electrode layer, a capacitive insulation layer, and an upper electrode layer; forming a conductive layer on the upper electrode layer; performing a hydrogen doping process to the conductive layer; forming a metal layer on the conductive layer after the hydrogen doping process; and patterning the metal layer, the conductive layer, the upper electrode layer and the capacitive insulation layer to form a top electrode plate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
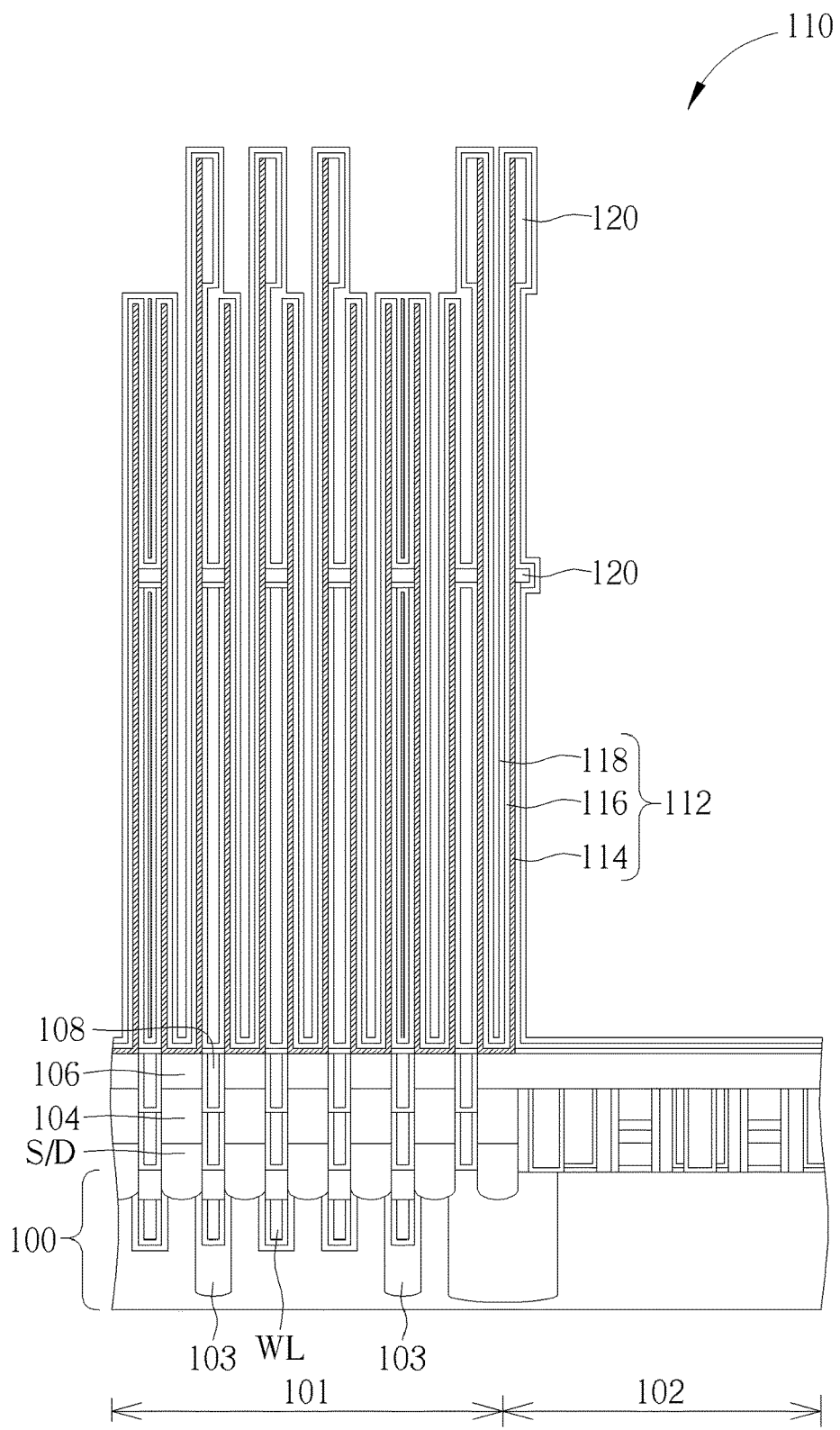
FIG. 1 to FIG. 5 are schematic cross-sectional views sequentially illustrating a manufacturing method of a semiconductor device according to an embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

The term "substrate," "semiconductor substrate" or "wafer" as described throughout, is most commonly a silicon substrate or a silicon wafer. However, term "substrate" or "wafer" may also refer to any semiconductor material such as germanium, gallium arsenide, indium phosphide, and the like. In other embodiments, the term "substrate" or "wafer" may be non-conductive, such as a glass or sapphire wafer. In addition, the term "capacitor" as used herein refers to a storage node in the architecture of dynamic random access memory (DRAM); it may be different names in other electronic components or memory architecture.

FIG. 1 to FIG. 5 are schematic cross-sectional views sequentially illustrating a manufacturing method of a semiconductor device according to an embodiment of the present invention. First, a semiconductor substrate 100 is prepared, which may include a memory cell region 101 and a peripheral region 102. The substrate 100 may be a silicon substrate, a silicon on insulator (SOI) substrate, a germanium substrate, a germanium-on-insulator substrate (GOI), or a silicon germanium substrate, or the like. The substrate 100 is formed with an isolation structure 103, which may be formed by forming a trench and then filling in an insulating material including silicon oxide, silicon nitride, or silicon oxide. The isolation structure 103 defines the active area in the memory cell region in a two-dimensional plane.

A word line WL is already formed in the substrate 100. For the recessed gate structure, it is generally embedded in the substrate at a predetermined depth and penetrates through the isolation structure 103 and the active area and extends along a direction. The word line WL serves as a gate to control the switching of the memory cell and includes, but not limited to, a doped semiconductor material (such as doped silicon), a metal material (such as tungsten, aluminum, titanium, or tantalum), and conductivity metal materials (such as titanium nitride, tantalum nitride, or tungsten nitride), or metal semiconductor compounds (such as silicon nitride). The active areas on both sides of the word line WL may be doped with dopants, such as P-type or N-type dopants, to form a source/drain doped region S/D.

A storage node contact structure 104 is formed above the source/drain doped region S/D, and its material may include, but is not limited to, a doped semiconductor material (such as doped silicon), a metal material (such as tungsten, aluminum, titanium, or tantalum), and conductivity metal materials (such as titanium nitride, tantalum nitride, or tungsten nitride), or metal semiconductor compounds (such as silicon nitride). A capacitor landing pad 106 is further formed on the storage node contact structure 104 to be connected with the capacitor structure above. The material of the capacitor landing pad 106 may be tungsten metal. Each stacked structure including the source/drain doped regions S/D, the storage node contact structure 104, and the capacitor landing pad 106 in the drawings corresponds to a capacitor unit above, and the stacked structures separated from each other through a spacing structure 108, such as silicon carbonitride (SiCN) material.

A capacitor structure 110 is formed above the memory cell region 101, wherein the capacitor structure 110 includes a plurality of capacitor units 112 respectively connected to the capacitor landing pads 106 below. In the embodiment of the present invention, each capacitor unit 112 is composed of a lower electrode layer 114, a capacitive insulation layer 116, and an upper electrode layer 118. A material of the lower electrode layer 114 and the upper electrode layer 118 may be titanium nitride (TiN), which may be formed by continuous flow deposition and has a thickness of about 50 angstroms (Å). The capacitive insulation layer 116 may be an alternating layered structure (ZAZ) of zirconium oxide (ZrO) and aluminum oxide ($Al_2O_3$), which is formed between the lower electrode layer 114 and the upper electrode layer 118 by atomic layer deposition and has a thickness of about 65 angstroms (Å). A supporting structure 120 may be formed around the capacitor units 112 to separate the two capacitor units 112 and provide the required structural strength of the capacitor structure 110. Since the focus of the present invention is the manufacturing of the capacitor structure 110, the details of the components in the substrate 100 and the components of the capacitor structure 110 will not be described in detail herein to avoid obscuring the focus of the present invention.

Figure 2:
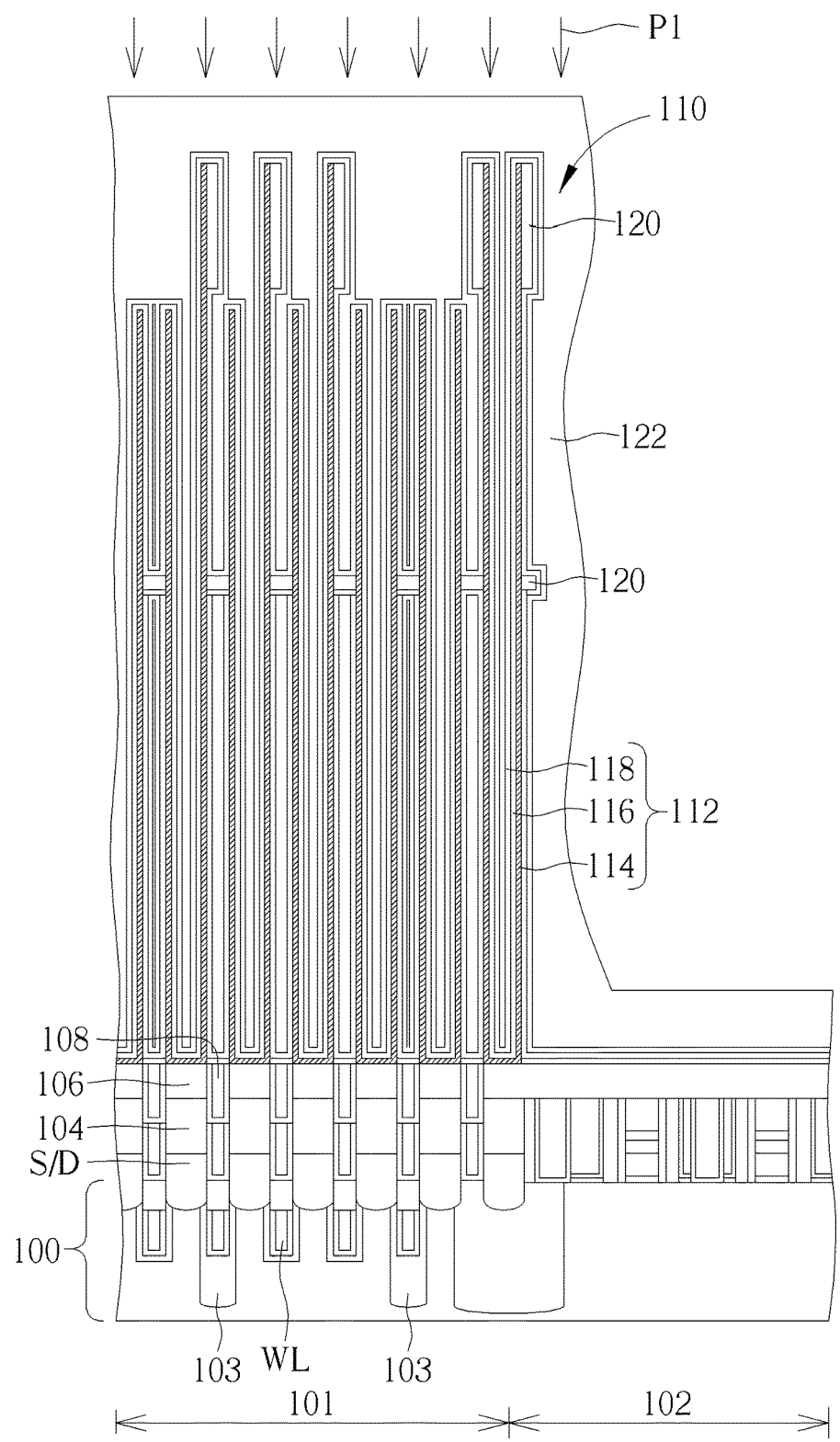

Next, referring to FIG. 2, a conductive layer 122 is formed on the capacitor structure 110 to fill a space between the capacitor units 112. A material of the conductive layer 122 may be silicon, silicon germanium (SiGe), or silicon phosphorus (SiP), which may be formed on a surface of the upper electrode layer 118 of the capacitor structure 110 by low-pressure chemical vapor deposition (LPCVD). The conductive layer 122 may be doped with elements such as boron or phosphorus.

After the conductive layer 122 for filling is formed, a hydrogen doping process P1 is performed to the conductive layer 122, such as a plasma doping or an ion implantation process, to introduce the hydrogen element in the conductive layer 122. A doping amount of the hydrogen doping process is between $1*10^{15}$ and $1*10^{17}$ (/cm$^2$), and a doping energy is between 100 eV and 20 KeV. In the embodiment of the present invention, introducing the hydrogen component into the conductive layer 122 can effectively avoid the loss of stored charge in the capacitor unit, thereby reducing the refreshing rate of the capacitor and reducing the energy consumption required from the operation of the DRAM device. Moreover, the hydrogen doping process P1 is preferably performed immediately after the formation of the conductive layer 122, so that a better hydrogen doping effect can be achieved. If the hydrogen doping process P1 is performed after the subsequent formation of other layer structures, for example, after the formation of other metal layers, the effect of hydrogen doping is greatly reduced. In addition, after the hydrogen doping process P1, a thermal process, such as an annealing process at a temperature of 200° C.-800° C., may be performed to promote a diffusion of hydrogen ions in the conductive layer 122.

Figure 3:
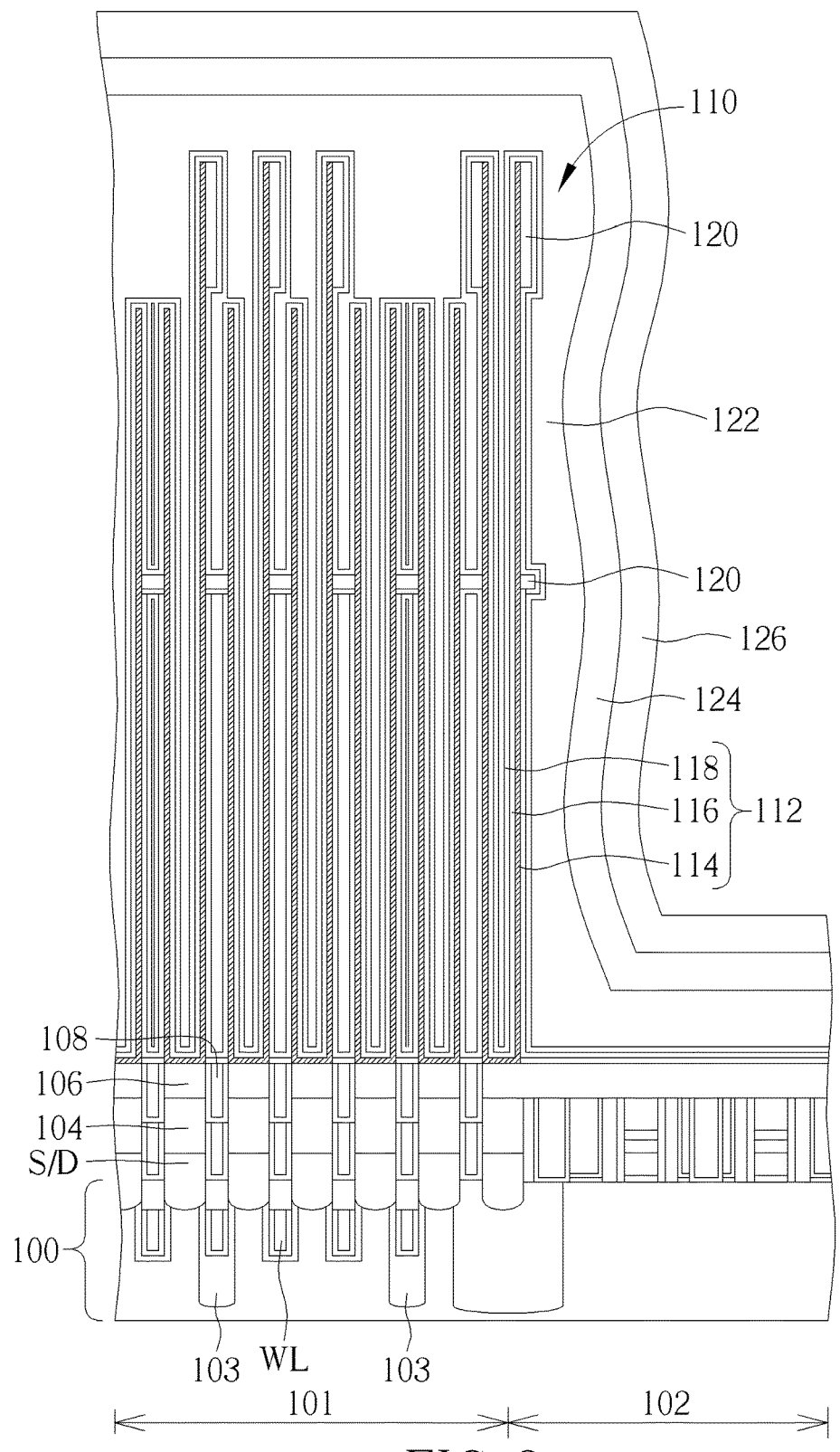
Figure 4:
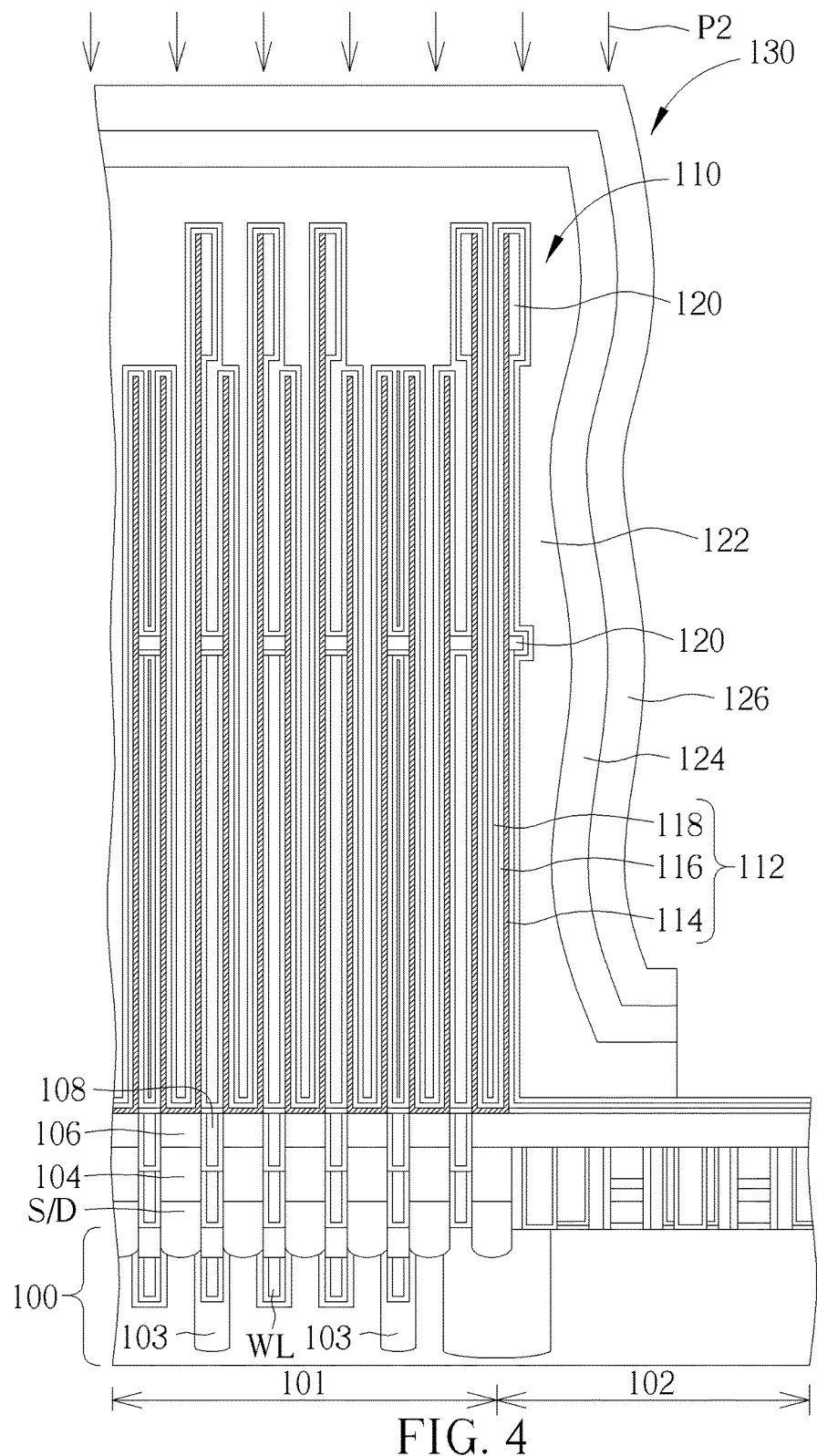

Please refer to FIG. 3, a metal layer 124 and an oxide layer 126 are sequentially formed on the conductive layer 122 after the hydrogen doping process P1. The metal layer 124 may be a low-resistance tungsten layer with a thickness of about 700 angstroms (Å). The metal layer 124 may be formed on the conductive layer 122 by sputtering. The conductive layer 122 and the metal layer 124 may also form an adhesive layer, such as a polysilicon layer, to prevent the metal layer 124 peeling off from the conductive layer 122. A material of the oxide layer 126 is tetraethoxysilane (TEOS) and has a thickness of about 700 angstroms (Å). The oxide layer 126 may be formed on the metal layer 124 by chemical vapor deposition to provide a protection effect of the metal layer 124 before the subsequent process.

After the metal layer 124 is formed, a photolithography process P2 is next performed to pattern the oxide layer 126, the metal layer 124, the conductive layer 122, and the upper electrode layer 118 and the capacitive insulation layer 116 of the capacitor structure 110 to form a top electrode plate 130. The photolithography process removes unwanted metal layer 124, conductive layer 122, upper electrode layer 118, and capacitive insulation layer 116 in the peripheral region 102.

Figure 5:
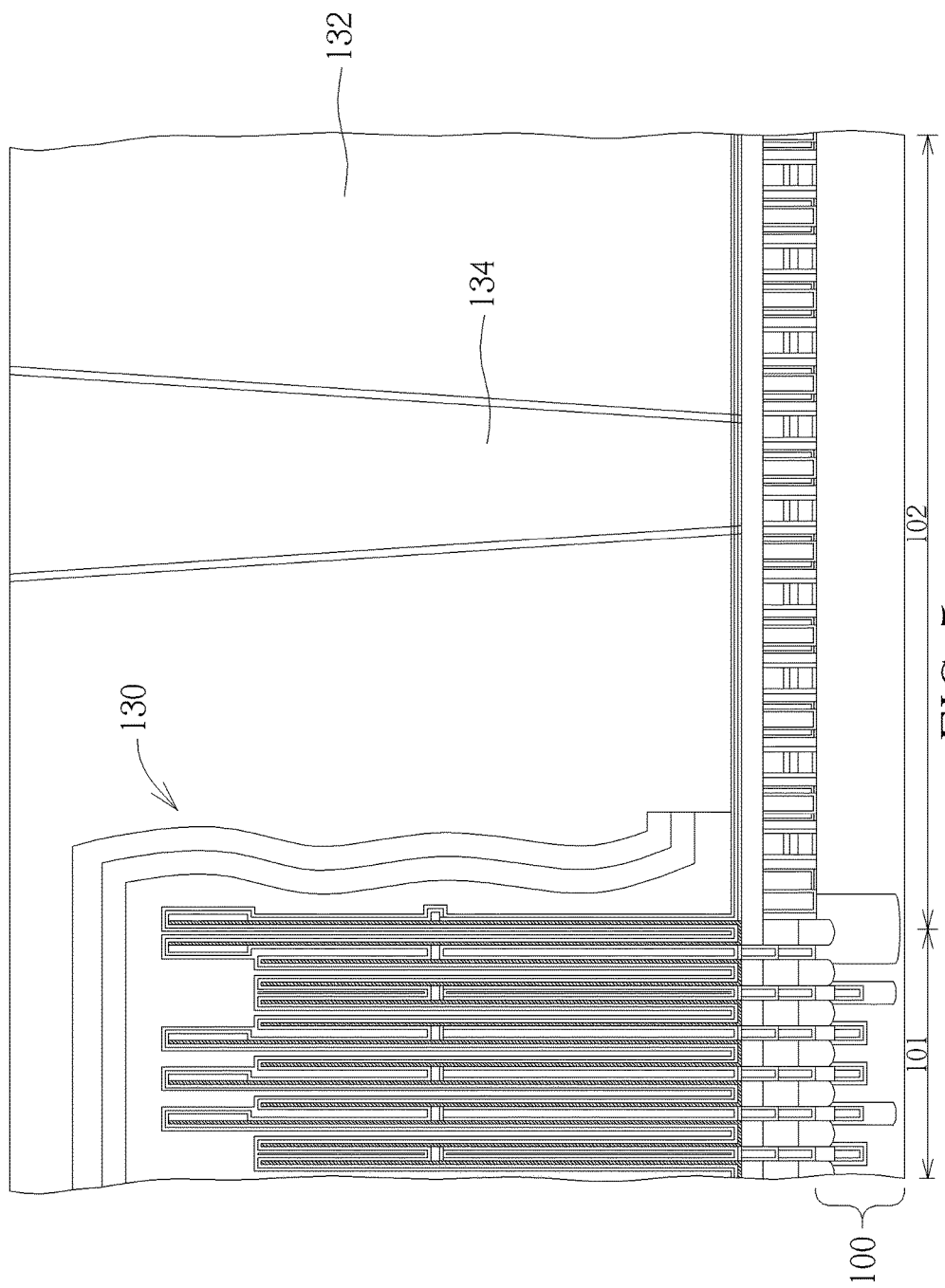

Finally, referring to FIG. 5, a pre-metal dielectric (PMD) 132 is formed on the entire substrate 100 after forming the top electrode plate 130. The pre-metal dielectric layer 132 may be formed by using a CVD process, wherein the pre-metal dielectric layer 132 covers the entire memory cell region 101 including the top electrode plate 130 and the peripheral region 102. The pre-metal dielectric layer 132 is planarized by a chemical mechanical polishing (CMP) process, and then a contact hole and a contact structure 134 are formed in a portion thereof in the peripheral region 102 by a photolithography process, wherein the contact structure 134 connects the semiconductor elements below it, such as a bit line or the like.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:
    providing a substrate having at least one capacitor structure, wherein the capacitor structure comprising a lower electrode layer, a capacitive insulation layer, and an upper electrode layer;
    forming a conductive layer on the upper electrode layer;

performing a hydrogen doping process to the conductive layer;

forming a metal layer on the conductive layer after the hydrogen doping process; and patterning the metal layer, the conductive layer, the upper electrode layer and the capacitive insulation layer to form a top electrode plate.

2. The method of manufacturing a semiconductor device according to claim 1, wherein the conductive layer comprises silicon, silicon germanium (SiGe), or silicon phosphorus (SiP).

3. The method of manufacturing a semiconductor device according to claim 1, wherein the conductive layer is doped with boron or phosphorus.

4. The method of manufacturing a semiconductor device according to claim 1, wherein the conductive layer is formed by a low-pressure chemical vapor deposition process.

5. The method of manufacturing a semiconductor device according to claim 1, wherein the metal layer comprises tungsten.

6. The method of manufacturing a semiconductor device according to claim 1, further comprising forming an oxide layer on the substrate after forming the conductive layer.

7. The method of manufacturing a semiconductor device according to claim 1, further comprising forming a pre-metal dielectric layer on the substrate after forming the top electrode plate.

8. The method of manufacturing a semiconductor device according to claim 1, further comprising performing a thermal process after the hydrogen doping process to enhance the diffusion of the doped hydrogen ions.

9. The method of manufacturing a semiconductor device according to claim 8, wherein a temperature of the thermal process is between 200° C. and 800° C.

10. The method of manufacturing a semiconductor device according to claim 1, wherein a doping amount of the hydrogen doping process is between $1*10^{15}$ and $1*10^{17}$ ($/cm^2$), and a doping energy is between 100 eV and 20 KeV.

* * * * *